United States Patent
Lappoehn (10) Patent No.: US 8,622,751 B2
(45) Date of Patent: Jan. 7, 2014

(54) PLUG CONNECTOR AND MULTI-LAYER CIRCUIT BOARD

(75) Inventor: Juergen Lappoehn, Gammelshausen (DE)

(73) Assignee: ERNI Electronics GmbH & Co. KG, Adelberg (DE)

( * ) Notice: Subject to any disclaimer, the term of this patent is extended or adjusted under 35 U.S.C. 154(b) by 113 days.

(21) Appl. No.: 13/392,933

(22) PCT Filed: Aug. 17, 2010

(86) PCT No.: PCT/EP2010/005033
§ 371 (c)(1),
(2), (4) Date: Mar. 28, 2012

(87) PCT Pub. No.: WO2011/023317
PCT Pub. Date: Mar. 3, 2011

(65) Prior Publication Data
US 2012/0184115 A1    Jul. 19, 2012

(30) Foreign Application Priority Data
Aug. 31, 2009  (EP) .................................. 09011143

(51) Int. Cl.
*H01R 12/00*  (2006.01)
(52) U.S. Cl.
USPC ............................................. 439/65; 439/62
(58) Field of Classification Search
USPC .............. 439/65, 67, 74, 75, 79, 540.1, 701
See application file for complete search history.

(56) References Cited

U.S. PATENT DOCUMENTS 3,660,726 A * 5/1972 Ammon et al. ................ 174/262
4,707,039 A * 11/1987 Whipple .......................... 439/75

(Continued)

FOREIGN PATENT DOCUMENTS

DE      40 02 025      8/1990
DE      296 01 655     5/1996

(Continued)

OTHER PUBLICATIONS

European Search Report dated Jan. 25, 2010 in European Patent Application 09011143.6, with English translation of relevant parts.

(Continued)

*Primary Examiner* — Amy Cohen Johnson
*Assistant Examiner* — Vladimir Imas
(74) *Attorney, Agent, or Firm* — Collard & Roe, P.C.

(57) ABSTRACT

The invention relates to a multi-pole plug connector (90) for contacting a multi-layer circuit board (51), comprising a plurality of contact elements (50*a*, 50*b*-50'*a*, 50'*b*), as well as to a multi-layer circuit board for assembly with a multi-pole plug connector (90), comprising blind boreholes (60*a*, 60*b*-60'*a*, 60'*b*) for contacting terminal pins (53*a*, 53*b*-53'*a*, 53'*b*) of the contact elements (50*a*, 50*b*-50'*a*, 50'*b*) of the multi-pole plug connector (90). The invention further relates to a combination of a multi-pole plug connector (90) for contacting with a multi-layer circuit board (51) and to a multilayer circuit board for assembly with the multi-pole plug connector (90). The plug connector (90) according to the invention is characterized by terminal pins (53*a*, 53*b*-53'*a*, 53'*b*) that have different lengths for contacting the terminal pins (53*a*, 53*b*-53'*a*, 53'*b*) with conductors (52*a*, 52*b*; 72*a*, 72*b*-72'*a*, 72'*b*) of the multi-layer circuit board (51) provided in different conductor levels (71-71'). The multi-layer circuit board (51) according to the invention is characterized by blind boreholes (60*a*, 60*b*-60'*a*, 60'*b*) that terminate in different conductor levels (71-71') of the multilayer circuit board (51) for deliberately contacting the terminal pins (53*a*, 53*b*-53'*a*, 53'*b*) with conductors (52*a*, 52*b*; 72*a*, 72*b*-72'*a*, 72'*b*) of the multilayer circuit board (51) provided in different conductor levels (71-71').

13 Claims, 6 Drawing Sheets

(56) References Cited

U.S. PATENT DOCUMENTS

| | | | |
|---|---|---|---|
| 5,037,314 A * | 8/1991 | Bricaud et al. | 439/79 |
| 5,038,252 A | 8/1991 | Johnson | |
| 5,201,662 A * | 4/1993 | Roche | 439/79 |
| 5,310,362 A * | 5/1994 | Bauerle et al. | 439/620.21 |
| 5,321,884 A * | 6/1994 | Ameen et al. | 29/830 |
| 5,354,219 A * | 10/1994 | Wanjura | 439/607.12 |
| 5,797,757 A * | 8/1998 | Aoki | 439/101 |
| 5,819,401 A * | 10/1998 | Johannes et al. | 29/830 |
| 6,129,591 A | 10/2000 | Czeschka | |
| 6,196,876 B1 * | 3/2001 | Paagman | 439/607.36 |
| 6,280,201 B1 * | 8/2001 | Morris | 439/65 |
| 6,394,822 B1 | 5/2002 | McNamara | |
| 6,538,538 B2 * | 3/2003 | Hreish et al. | 333/246 |
| 6,661,316 B2 * | 12/2003 | Hreish et al. | 333/246 |
| 6,817,870 B1 | 11/2004 | Kwong et al. | |
| 6,822,874 B1 * | 11/2004 | Marler | 361/752 |
| 6,971,896 B2 * | 12/2005 | Bartley et al. | 439/215 |
| 6,976,886 B2 | 12/2005 | Winings et al. | |
| 7,278,855 B2 * | 10/2007 | Yasumura et al. | 439/65 |
| 7,651,336 B2 * | 1/2010 | Yasumura et al. | 439/65 |
| 7,665,883 B2 * | 2/2010 | Matheson | 362/652 |
| 7,708,564 B2 * | 5/2010 | Fogg et al. | 439/65 |
| 7,878,854 B2 * | 2/2011 | Morgan et al. | 439/607.39 |
| 7,901,248 B2 * | 3/2011 | Lappoehn | 439/607.05 |
| 8,047,855 B2 * | 11/2011 | Yasamura et al. | 439/65 |
| 8,057,240 B2 * | 11/2011 | Morgan | 439/55 |
| 8,491,313 B2 * | 7/2013 | McNamara et al. | 439/59 |
| 2009/0053943 A1 * | 2/2009 | Fink et al. | 439/876 |
| 2010/0178802 A1 * | 7/2010 | Lappoehn | 439/607.05 |

FOREIGN PATENT DOCUMENTS

| | | |
|---|---|---|
| DE | 196 04 432 | 8/1997 |
| DE | 198 07 713 | 6/1999 |
| DE | 199 02 950 | 12/1999 |
| DE | 100 40 303 | 4/2002 |
| DE | 699 15 882 | 3/2005 |
| DE | 10 2007 060429 | 6/2009 |

OTHER PUBLICATIONS

Meinke and Grundlach "Taschenbuch für Hochfrequenztechnik" (Pocketbook on High Frequency Technology), Springer-Verlag 1956, Table of Contents and pp. 14, 48 and 165 (total pp. 6). (Spec., p.3).

International Search Report of PCT/EP2010/005033, dated Sep. 29, 2010.

International Preliminary Report on Patentability of PCT/EP2010/005033 dated Mar. 15, 2012 and Written Opinion of the International Searching Authority.

* cited by examiner

PLUG CONNECTOR AND MULTI-LAYER CIRCUIT BOARD

CROSS REFERENCE TO RELATED APPLICATIONS

This application is the National Stage of PCT/EP2010/005033 filed on Aug. 17, 2010, which claims priority under 35 U.S.C. §119 of European Application No. 09011143.6 filed on Aug. 31, 2009, the disclosure of which is incorporated by reference. The international application under PCT article 21(2) was not published in English.

BACKGROUND OF THE INVENTION

The invention relates to a multi-pole plug connector for contacting a multi-layer circuit board, a multi-layer circuit board for assembly with a multi-pole plug connector, and a combination of a multi-pole plug connector and a multi-layer circuit board for assembly with the plug connector.

DESCRIPTION OF THE PRIOR ART

The published application DE 100 40 303 A1 describes a method for the defined depth-controlled drilling of blind holes in multi-layer circuit boards. Test drilling is provided, in which the precise depth of the respective strip conductor layer is determined in such a way that a current flow is detected once the tip of the drill reaches the strip conductor layer. The detection of strip conductor layers which are disposed behind one another in the drilling direction thereby reliably enables that a drill with lower drilling diameter can be used from strip conductor layer to strip conductor layer, so that short-circuits between the different strip conductor layers are prevented.

The published application DE 199 02 950 A1 describes the production of a circuit board which can be mounted on both sides with plug connectors. The circuit board is composed of two multi-layer circuit boards which are glued together. The two circuit boards contain a plurality of plated-through holes which are in connection with one another by the strip conductors of the multi-layer circuit board. The plated-through holes are provided for accommodating the terminal pins of the plug connectors. The terminal pins are pressed into the holes, by means of which the electric and simultaneously the mechanic connection with the holes is to be produced.

The circuit board described in the utility model DE 296 01 655 U1 which is also provided for contacting with plug connectors on both sides is also produced by two multi-layer circuit boards which are glued together. The terminal pins of the plug connectors are pressed into the holes which can be realised as blind holes.

The multi-layer circuit board described in the published application DE 40 02 025 A1 contains throughplatings in the form of continuously conductively coated walls of holes which comprise contacting points with selected strip conductor layers of the multi-layer circuit board. The throughplatings have a region with an increased cross section at the other end. The increased cross section is formed in at least one cover plate which is laminated separately. The regions with the increased cross section are provided for accommodating terminal pins of plug connectors. Some of the holes can be blind in order to prevent that they are short-circuited with strip conductor layers disposed beneath the same.

The patent specification DE 699 15 882 T2 describes a plug connector which is suitable for high high-frequency data transmission. A contact element conducting screen or ground potential is associated to each signal-conducting contact element. The alignment of the contact elements is made in such a way that impedance adjustment is enabled.

The patent specification U.S. Pat. No. 6,976,886 B2 describes a plug connector in which as a result of a special arrangement and alignment of the contact elements conducting the signals and conducting the screen or ground potential with respect to each other it is intended to achieve a high screening effect of the signal-conducting lines with respect to each other and the plug connector in its entirety. The known plug connector is especially suitable for high-frequency signals, with the arrangement of the signal-conducting and ground-potential-conducting contact elements being further especially predetermined for achieving a specific characteristic impedance.

The published application DE 198 07 713 A1 describes a plug connector which comprises a large number of contact elements. The known plug connector is provided for producing plug connections between backplanes and plug-in cards, wherein in the specific embodiment plug connections are produced between backplanes and plug-in cards of so-called compact PCI systems.

The textbook of Meinke and Grundlach "Taschenbuch für Hochfrequenztechnik" (Pocketbook on High Frequency Technology), Springer-Verlag 1956, explains the fundamental terms of electrical engineering such as capacitance, inductance and characteristic impedance.

The invention is based on the object of providing a multi-pole plug connector for contacting a multi-layer circuit board, a multi-layer circuit board for assembly with a multi-pole plug connector, and a combination of a multi-pole plug connector and a multi-layer circuit board for assembly with the plug connector for conducting signals with very high frequencies, especially digital signals.

This object is achieved by the features stated in the independent claims.

SUMMARY OF THE INVENTION

The multi-pole plug connector for contacting a multi-layer circuit board is based on a plurality of contact elements. The plug connector in accordance with the invention is characterised in that the terminal pins of the contact elements have different lengths for contacting the terminal pins with conductor strips of the multi-layer circuit board provided in different conductor strip levels.

The multi-layer circuit board for assembly with a multi-pole plug connector is provided with blind holes for contacting terminal pins of the contact elements of the multi-pole plug connector. The multi-layer circuit board in accordance with the invention is characterised in that the blind holes terminate in different conductor levels of the multi-layer circuit board for deliberately contacting the terminal pins with conductor strips of the multi-layer circuit board provided in different conductor levels.

In the combination in accordance with the invention consisting of a multi-pole plug connector and a multi-layer circuit board it is provided that the multi-pole plug connector for contacting the multi-layer circuit board comprises a plurality of contact elements and that the multi-layer circuit board for assembly with the multi-pole plug connector comprises blind holes for contacting terminal pins of the contact elements of the multi-pole plug connector. The combination in accordance with the invention consisting of a multi-pole plug connector and a multi-layer circuit board adjusted to the assembly with the multi-pole plug connector is characterised in that the terminal pins of the contact elements of the plug connector have different lengths for contacting the terminal pins with strip conductors of the multi-layer circuit board provided in different strip conductor levels, and that the blind holes terminate in different strip conductor levels of the multi-layer circuit board for deliberately contacting the terminal pins of the contact elements which are adjusted in their length.

The multi-pole plug connector in accordance with the invention, the multi-layer circuit board in accordance with the invention and the combination of the multi-pole plug connector and the multi-layer circuit board in accordance with the invention allow a high density of the contact elements of the plug connector. This is achieved by a respectively high density of strip conductors in the multi-layer circuit board which are available for contacting the terminal pins of the contact elements of the plug connector.

An important advantage is achieved in such a way that the strip conductors of the multi-layer circuit board which are provided in different strip conductor levels can now be provided with a simple geometrical configuration. In particular, all strip conductors can be guided away from the terminal pins of the contact elements of the plug connector in a straight line without any avoiding curves, As a result, the multi-pole plug connector in accordance with the invention, the multi-layer circuit board in accordance with the invention and the combination of the multi-pole plug connector and the multi-layer circuit board in accordance with the invention are suitable for very high frequencies of the signals conducted via the contact elements of the plug connector, which in the case of digital signals can be up to 40 gigabits per second without attenuation becoming too large or the eye pattern folding up.

The multi-pole plug connector in accordance with the invention, the multi-layer circuit board in accordance with the invention and the combination of the multi-pole plug connector and the multi-layer circuit board in accordance with the invention are especially suitable in applications in which the multi-layer circuit board is used as a backplane or in which the multi-layer circuit board is used for contacting a backplane. With this technology, devices are especially realised in communications engineering which process high-frequency digital signals for signal transmissions of the internet for example.

Advantageous further developments and embodiments of the multi-pole plug connector in accordance with the invention, the multi-layer circuit board in accordance with the invention and the combination of the multi-pole plug connector and the multi-layer circuit board in accordance with the invention are obtained from the dependent claims.

One embodiment of the multi-pole plug connector in accordance with the invention provides that the terminal pins of the plug connector, which in the assembled state with the multi-layer circuit board are arranged closer to the edge of the multi-layer circuit board, are the longest and terminate afterwards with a shorter length in steps. Accordingly, a corresponding embodiment of the multi-layer circuit board in accordance with the invention provides that the blind holes at the edge of the multi-layer circuit board are the deepest and terminate thereafter less deep in steps. These measures can be used to approximate a compensation of the resulting line lengths of the contact element rows of the plug connector which are disposed above one another in such a way that the contact elements arranged at the bottom end of the plug connector can have longer terminal pins than the terminal pins of the contact elements of the contact element rows which are arranged further up in the plug connector, when assuming a multi-pole elbow plug connector.

An especially advantageous measure provides that the terminal pins of pairs of signal-conducting contact elements of the multi-pole plug connector, which are arranged in a contact element row of the plug connector next to one another, are of equal length. A corresponding, especially advantageous measure provides accordingly that the blind holes in the multi-layer circuit board which are arranged for contacting terminal pins pairs of contact elements which are arranged in a row of contact elements of the plug connector next to one another terminate equally deep in the multi-layer circuit board. As a result of these measures, the electrical properties both of the multi-pole plug connector and also the multi-layer circuit board can be adjusted deliberately to the signals conducted by the signal-conducting contact elements in the region of the strip conductors provided for contacting the terminal pins of the plug connector. As a result, these measures act in an especially advantageous way when the respective pairs of contact elements conduct differential signals between which there should not be any signal runtime differences.

The described measure is preferably provided for all contact elements of the plug connector which are disposed in a row of contact elements. Accordingly, the corresponding measure preferably for the blind holes in the multi-layer circuit board is provided, which blind holes are provided for contacting the terminal pins of the contact elements of the plug connector which are disposed in a row of contact elements. Identical electrical properties are provided thereby for several pairs of contact elements which preferably conduct differential signals.

An advantageous further development of the combination of the multi-pole plug connector and the multi-layer circuit board in accordance with the invention provides that the terminal pins at least approximately fill up the depth of the respective blind holes associated with the terminal pins. High mechanical stability of the plug connector contacting the multi-layer circuit board is achieved with this measure, which thereby is capable of providing a high extraction force.

Another advantageous further development provides that the pairs of contact elements of the plug connector and/or the strip conductors of the multi-layer circuit board associated with the pairs of contact elements are realised at least approximately with a predetermined characteristic impedance. The characteristic impedance Zw, which is given by the connection Zw=root of inductance per unit length divided by capacitance per unit length (in loss-free lines), can therefore be determined by the geometrical relationships of the involved electrical conductors with respect to each other, i.e. especially the distance and the type of conductor and the dielectric, i.e. the material of the plug connector or the material of the multi-layer circuit board respectively between the involved conductor structures, in a deliberate manner to the predetermined value of the characteristic impedance. Details on the determination of the capacitance per unit length, inductance per unit length and the characteristic impedance can be obtained from the initially stated textbook by Meinke and Gundlach, especially the pages 14, 18 and 165.

Further advantageous developments and embodiments of the multi-pole plug connector in accordance with the invention for contacting a multi-layer circuit board, the multi-layer circuit board in accordance with the invention for assembly with the multi-pole plug connector in accordance with the invention and the combination of the multi-pole plug connector and the multi-layer circuit board in accordance with the invention for assembly with the multi-pole plug connector are provided in the description below and the drawings of the embodiment of the invention, wherein.

Figure 1:
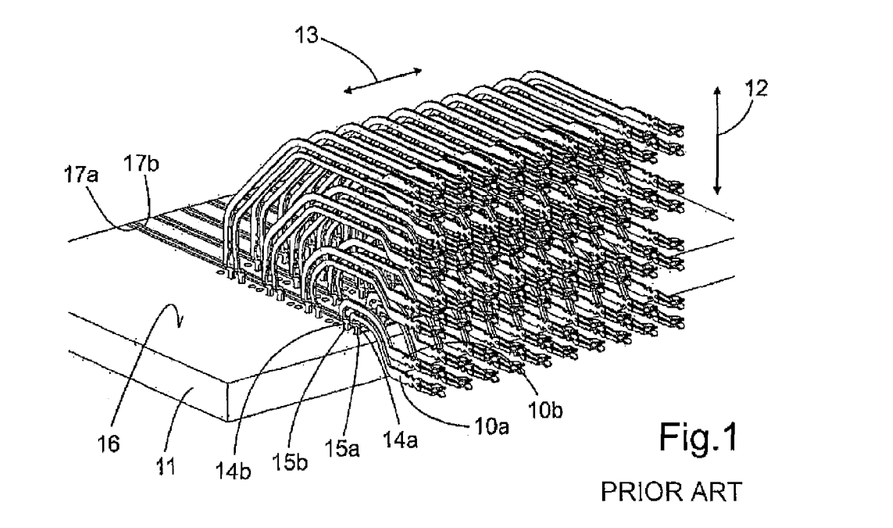
FIG. 1 shows an isometric view of contact elements of a multi-pole plug connector according to the state of the art which is in contact with a multi-layer circuit board.

FIG. 1 shows an isometric view of contact elements $10a$, $10b$ of a multi-pole plug connector according to the state of the art which contacts a multi-layer circuit board 11. The contact elements $10a$, $10b$ are respectively combined in pairs. Four pairs of contact elements are arranged in the contact gap direction 12, with ten gaps being provided in the contact row direction 13. The terminal pins $14a$, $14b$ of the contact elements $10a$, $10b$ are anchored in holes $15a$, $15b$ of the multi-layer circuit board 11. Two conductor strips $17a$, $17b$ are designated on the uppermost conduct strip level 16 of the multi-layer circuit board 11 which coincides with the surface of the multi-layer circuit board 11, which conductor strips contact the terminal pins $14a$, $14b$ of the contact elements $10a$, $10b$. The conductor strips $17a$, $17b$ lead to further components (not shown in closer detail) which can be arranged on the multi-layer circuit board 11.

Figure 2:
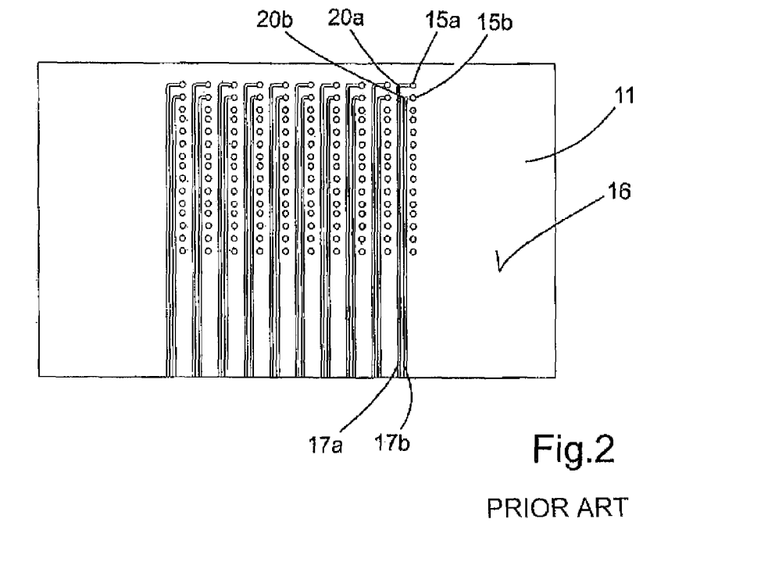
FIG. 2 shows a top view of the strip conductors of the uppermost strip conductor level of the multi-layer circuit board shown in FIG. 1.

FIG. 2 shows a top view of the uppermost strip conductor level 16 of the multi-layer circuit board 11 as shown in FIG. 1, which corresponds to the surface of the multi-layer circuit board 11. The curvatures $20a$, $20b$ of the conductor strips $17a$, $17b$ leading to the holes $15a$, $15b$ are clearly visible. The curvatures $20a$, $20b$ are necessary in order to enable non-crossing guidance of the conductor strips $17a$, $17b$.

Figure 3:
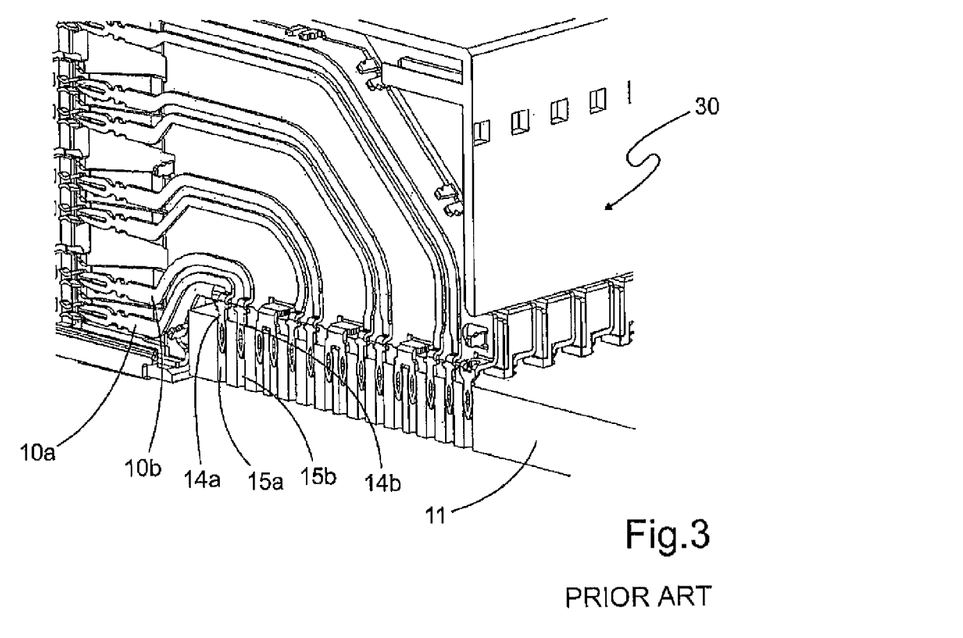
FIG. 3 shows an isometric view of a section through the plug connector as shown in FIG. 1.
Figure 4:
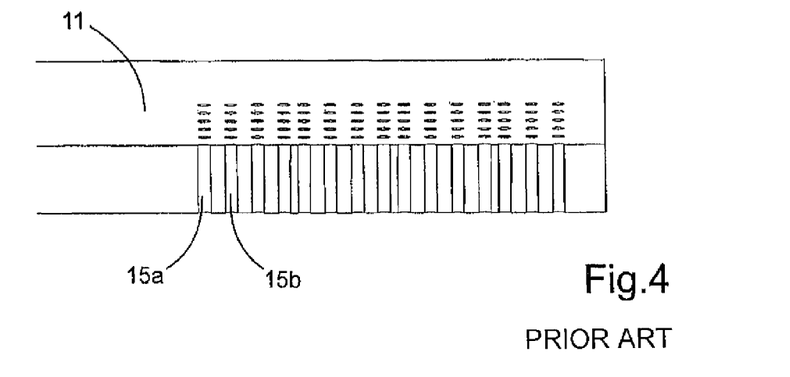
FIG. 4 shows a sectional view through the multi-layer circuit board as shown in FIG. 3.

FIG. 3 shows an isometric view of a section through a plug connector 30 according to the state of the art with the contact elements $10a$, $10b$ shown in FIG. 1. FIG. 3 shows the anchoring arrangement of the terminal pins $14a$, $14b$ of the contact elements $10a$, $10b$ in the holes $15a$, $15b$ of the multi-layer circuit board 11. Accordingly, the holes $15a$, $15b$ are drilled through the multi-layer circuit board 11. This fact is explained again in FIG. 4, representing a sectional view through the holes $15a$, $15b$ in the multi-layer circuit board 11.

In accordance with the state of the art, the multi-layer circuit board 11 can comprise strip conductors (not shown in closer detail) which extend in different strip conductor levels.

As a result of the holes $15a$, $15b$ drilled through the multi-layer circuit board 11, a large number of curvatures are required in the strip conductors which are optionally arranged in different strip conductor planes, of which the curvatures $20a$, $20b$ of the conductor strips $17a$, $17b$ are shown in FIG. 2 by way of example.

Figure 5:
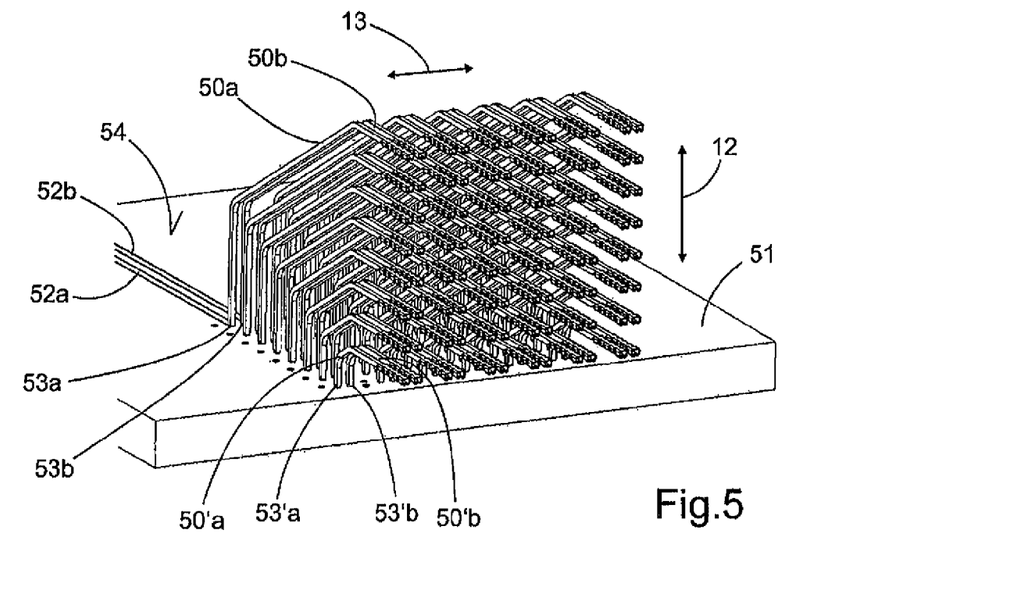
FIG. 5 shows an isometric view of contact elements of a multi-pole plug connector in accordance with the invention which is in contact with a multi-layer circuit board in accordance with the invention.

In the isometric view as shown in FIG. 5 of a plurality of contact elements $50a$, $50b$-$50'a$, $50'b$ of a multi-pole plug connector in accordance with the invention which is in contact with a multi-layer circuit board 51, the strip conductors $52a$, $52b$ of the contact elements $50a$, $50b$ are shown by way of example, which are guided away in a straight line without curvatures from the terminal pins $53a$, $53b$ of the contact elements $50a$, $60b$ (not shown in FIG. 5) on the uppermost strip conductor level 54 of the multi-layer circuit board 51, with the uppermost strip conductor level 54 simultaneously corresponding by way of example to the surface of the multi-layer circuit board 51 in accordance with the invention.

The contact elements $50a$, $50b$-$50'a$, $50'b$ are respectively arranged in pairs in the contact row direction 13, with the illustrated embodiment showing six pairs of contact elements in the contact row direction 13 and eight pairs of contact elements in the contact gap direction 12. The parts shown in FIG. 5 which correspond to the parts shown in the preceding drawings bear the same reference numerals. The same procedure also applies analogously to the following drawings in particular.

Figure 6:
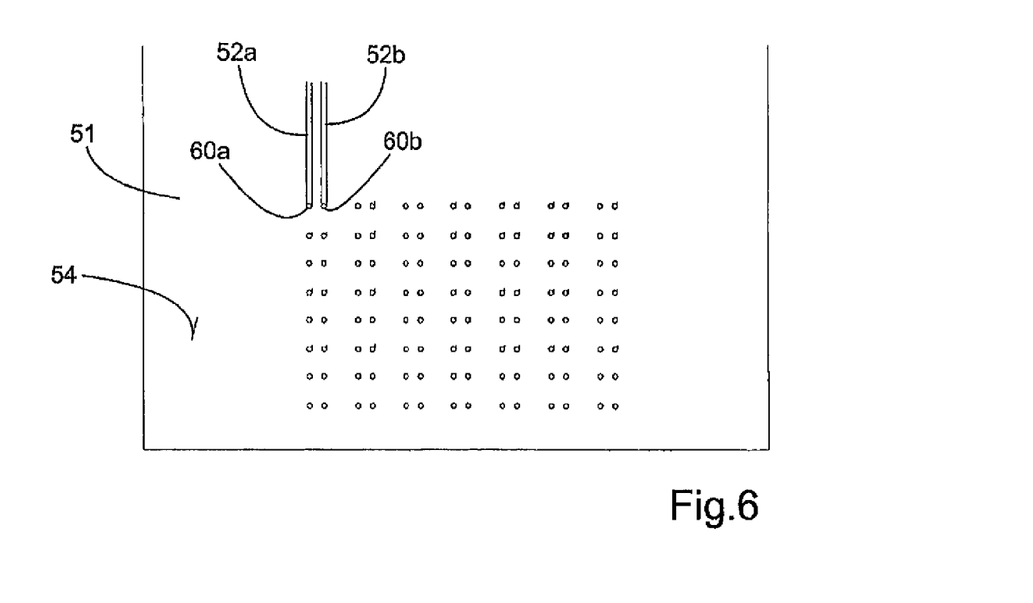
FIG. 6 shows a top view of the strip conductors of the uppermost superconductor level of the multi-layer circuit board in accordance with the invention as shown in FIG. 5.

The top view shown in FIG. 6 of the uppermost strip conductor level 54 of the multi-layer circuit board 51 in accordance with the invention illustrates the guidance of the strip conductors $52a$, $52b$ extending in a straight line and leading to the holes $60a$, $60b$ of the strip conductors $52a$, $52b$, in which the terminal pins $53a$, $53b$ of the contact elements $50a$, $50b$ are anchored.

Figure 7:
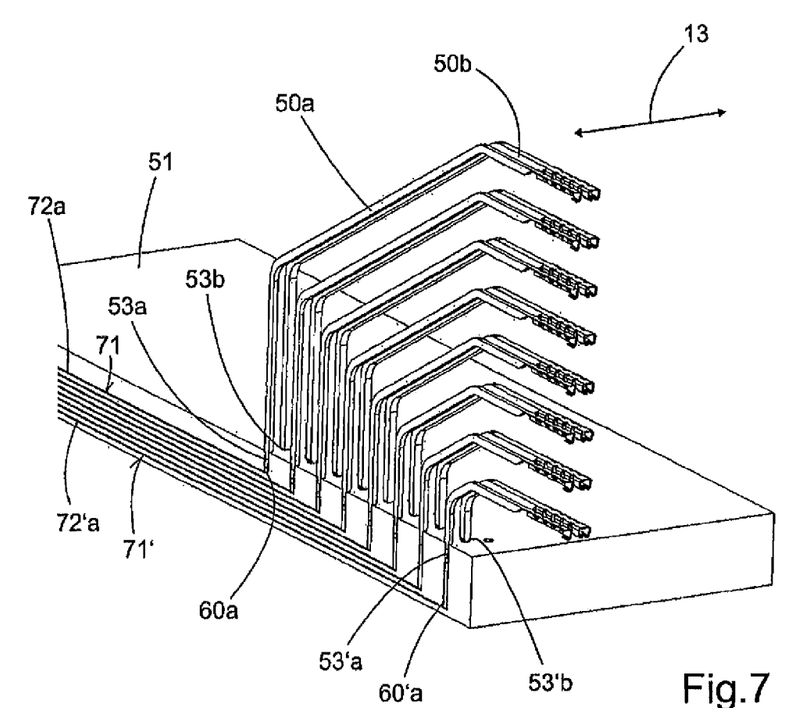
FIG. 7 shows an isometric view of a section through the multi-layer circuit board in accordance with the invention as shown in FIG. 5.

The possibility for guiding the strip conductors $52a$, $52b$ in a straight line will be illustrated in FIG. 7, which shows an isometric view of a section through the multi-layer circuit board 51 in accordance with the invention. Instead of the strip conductors $52a$, $52b$ as shown in FIGS. 5 and 6 on the surface of the multi-layer circuit board 51, strip conductors $72a$, $72b$-$72'a$, $72'b$ are provided in this case by way of example (also see FIG. 12) which are disposed within the multi-layer circuit board 51 in different strip conductor levels 71-71'. The holes $60a$-$60'a$ in the multi-layer circuit board 51 are arranged as blind holes, with the strip conductors $72a$, $72b$-$72'b$ guided in the different strip conductor levels 71-71' being guided to the individual blind holes $60a$, $60b$-$60'a$, $60'b$. FIG. 7 only shows the strip conductors $72a$-$72b$ and the blind holes $60a$-$60'a$ due to the sectional view. The lengths of the terminal pins $53a$, $53b$-$53'a$, $53'b$ of the contact elements $50a$, $50b$-$50'a$, $50'b$ must be adjusted to the blind holes $60a$, $60b$-$60'a$, $60'b$ in such a way that the terminal pins $53a$, $53b$-$53'a$, $53'b$ maximally have the length of the associated blind holes $60a$, $60b$-$60'a$, $60'b$.

Figure 8:
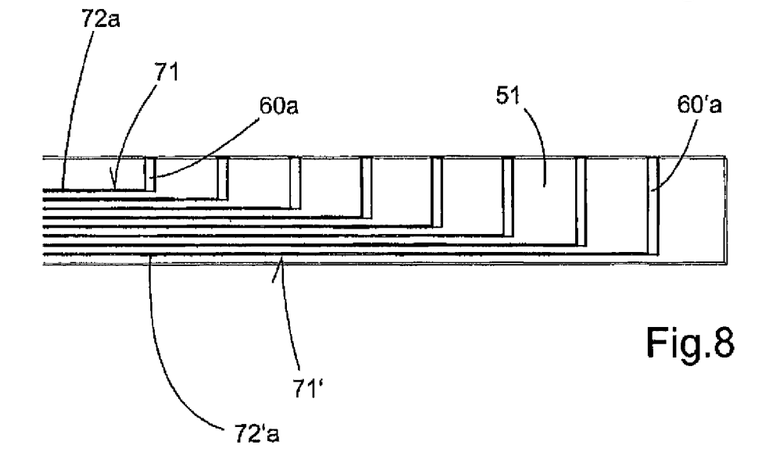
FIG. 8 shows a sectional view through the multi-layer circuit board in accordance with the invention as shown in FIG. 7.

FIG. 8 which shows a sectional view through the multi-layer circuit board 51 shown in FIG. 7 illustrates the blind holes $60a$, $60b$-$60'a$, $60'b$, with only the blind holes $60a$-$60'a$ being shown as a result of the sectional view, which end in respectively different strip conductor levels 71-71' in which the strip conductors $72a$, $72b$-$72'a$, $72'b$ are respectively housed, whereof the strip conductors $72a$-$72'a$ are shown. The strip conductors $72a$, $72b$-$72'a$, $72'b$ respectively represent the connections to the terminal pins $53a$, $53b$-$53'a$, $53'b$ of the contact elements $50a$, $50b$-$50'a$, $50'b$ which are provided in the blind holes $60a$, $60b$-$60'a$, $60'b$ and are not shown in FIG. 8, with metallizations being provided in the blind holes 60a, 60b-60'a, 60'b which enable electrical contact to the terminal pins 53a, 53b-53'a, 53'b to be soldered and preferably to be pressed.

FIGS. 7 and 8 show the advantageous embodiment of the arrangement of contact elements 50a, 50b-50'a, 50'b in pairs, with one pair of contact elements 50a, 50b-50'a, 50'b preferably conducting differential signals. Since the two contact elements 50a, 50b-50'a, 50'b of a pair of contact elements are arranged adjacent to one another in the contact row direction 13, it can be ensured that respectively the same length of the contact elements 50a, 50b-50'a, 50'b up to the terminal pins 53a, 53b-53'a, 53'b in the blind holes 60a, 60b-60'a, 60'b is available for the differential signals conducted via a pair of contact elements 50a, 50b-50'a, 50'b. A completely symmetrical configuration of pairs of contact elements 50a, 50b-50'a, 50'b is achieved, enabling the supply of very high signal frequencies to the pairs of contact elements 50a, 50b-50'a, 50'b of the plug connector in accordance with the invention and/or the multi-layer circuit board in accordance with the invention and/or the combination of multi-pole plug connector and multi-layer circuit board with very high signal frequencies in which only exceptionally low signal runtime differences are permitted to occur between the differential signals. Digital signals in the range of up to 40 gigabit/sec can be transmitted in an error-free manner.

The default value of a specific characteristic impedance such as 50 ohms for a pair of contact elements 50a, 50b-50'a, 50'b also plays a role, wherein the characteristic impedance, whose definition can be obtained from the textbook of Meincke and Gundlach as mentioned above, can be influenced to a substantial extent by the geometrical configuration of the contact elements 50a, 50b-50'a, 50'b, i.e. their shape and distance with respect to each other, and by the dielectric present between the pair of contact elements 50a, 50b-50'a, 50'b. The characteristic impedance can also be set within the multi-layer circuit board 51 by the respective dimensioning of the strip conductors 72a, 72b-72'a, 72'b by means of predetermining the so-called characteristic parameters. A minimization of the signal runtime difference is mainly achieved by the now enabled possible straight guidance of the individual strip conductors 52a, 52b; 72a, 72b-72'a, 72'b, with especially the straight and parallel guidance of the strip conductors of the strip conductors 52a, 52b; 72a, 72b-72'a, 72'b leading to one pair of contact elements 50a, 50b-50'a, 50'b making a decisive contribution to the runtime minimization.

Figure 9:
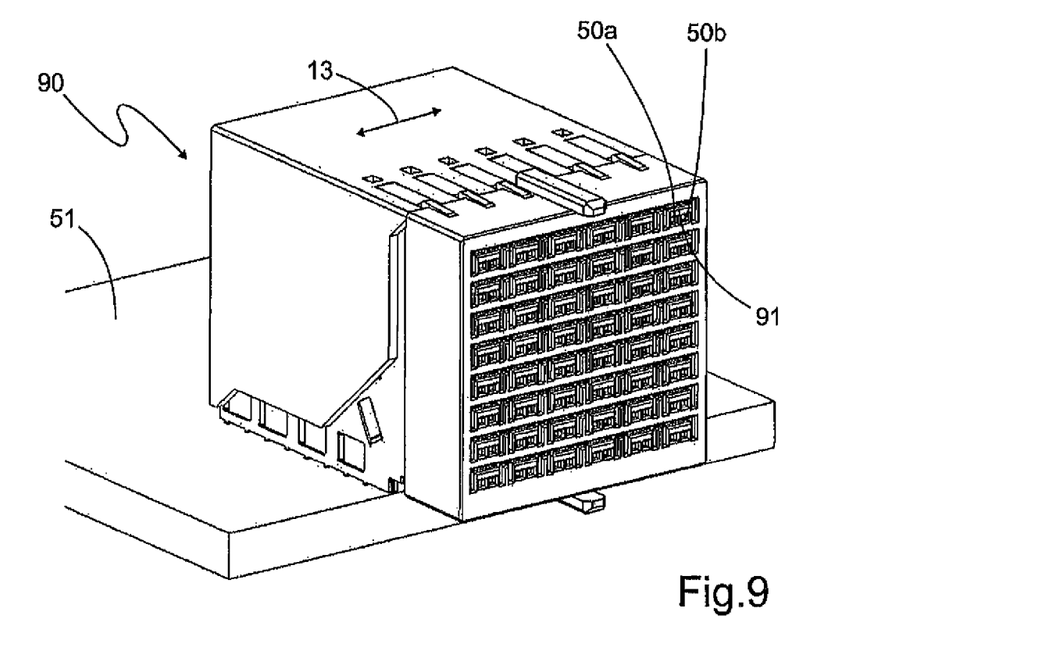
FIG. 9 shows an isometric view of the complete plug connector in accordance with the invention which is in contact with a multi-layer circuit board in accordance with the invention.
Figure 10:
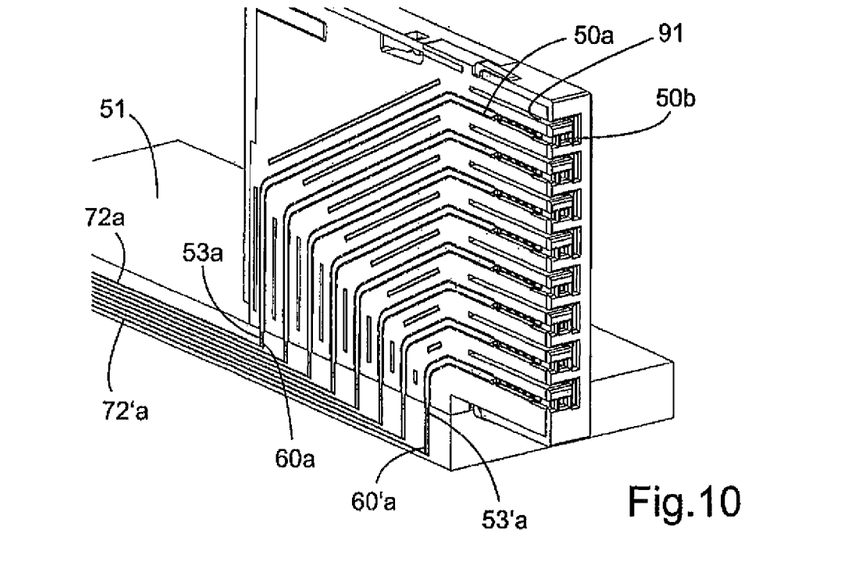
FIG. 10 shows an isometric view of a segment of the plug connector in accordance with the invention as shown in FIG. 9.

FIG. 9 shows a complete view of the plug connector 90 in accordance with the invention, which contacts the multi-layer circuit board 51 in accordance with the invention. A pair of contact elements 50a, 50b is designated which can be enclosed at least partly by a plug connector guide 91 for guiding a corresponding plug connector. For the purpose of illustrating the configuration of the plug connector 90 in accordance with the invention, FIG. 10 shows an isometric view of a segment of the plug connector 90 as shown in FIG. 9, with the illustration additionally showing the contact area with the terminal pins 53a-53'a and the strip conductors 72a-72'a which lead to the blind holes 60a-60'a.

Figure 11:
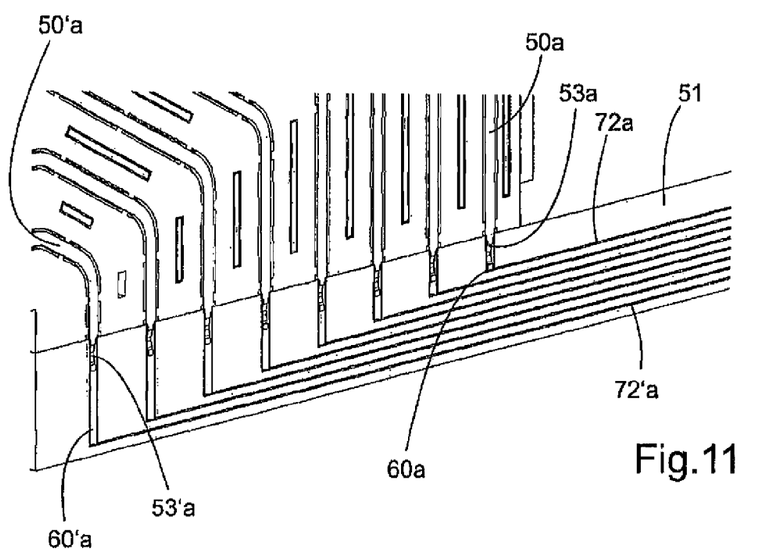
FIG. 11 shows an isometric view of a section in an enlarged view of a multi-layer circuit board according to FIG. 7.

FIG. 11 illustrates an embodiment in which the blind holes 60a-60'a are filled only partly by the terminal pins 53a-53'a of the contact elements 50a-50'a. In this embodiment, the terminal pins 53a will fill its associated blind hole 60a nearly completely by using the grading of the blind holes 60a-60'a concerning their depth, with the largest depth been predetermined at the edge of the multi-layer circuit board 51, whereas the terminal pin 53'a of the contact elements 50'a fills its associated blind hole 60'a only incompletely. The advantage of this embodiment is that the terminal pins 53a, 53b-53'a, 53'b of the contact elements 50a, 50b-50'a, 50'b can respectively be realised in an identical fashion.

Figure 12:
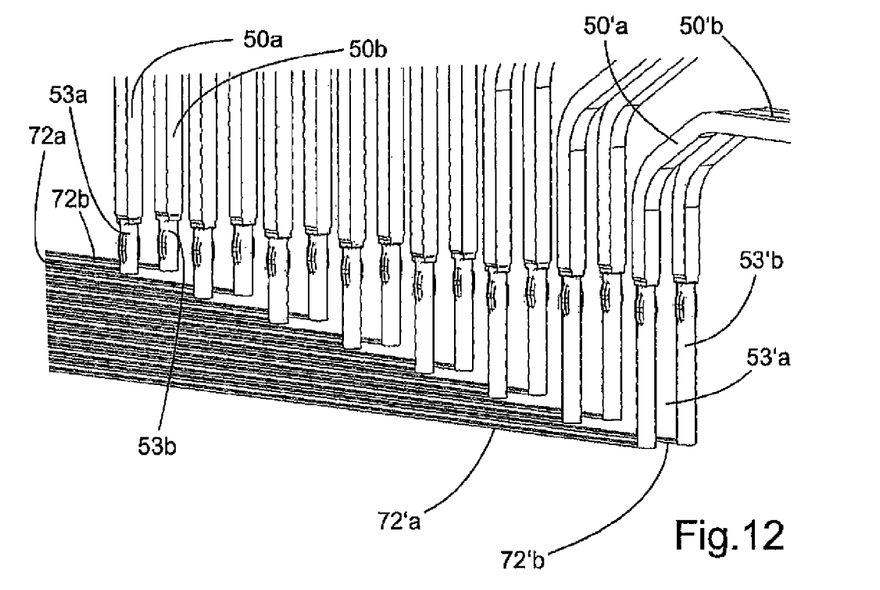
FIG. 12 shows a symmetric view of a section through a multi-layer circuit board in accordance with the invention according to an alternative embodiment.

An embodiment is shown in FIG. 12 which is alternative thereto, in which the terminal pins 53a, 53b-53'a, 53'b are respectively realised with the length which fills the blind holes 60a, 60b-60'a, 60'b (not shown in FIG. 12) in a respectively approximately complete manner. The advantage of this configuration is that the mechanical strength of the plug connector 90 in accordance with the invention which contacts the multi-layer circuit board 51 in accordance with the invention is increased by the virtually complete filling of the blind holes 60a, 60b-60'a, 60'b, so that the entire system can provide a high extraction force. The illustration in FIG. 12 is chosen in such a way that the strip conductors arranged in different strip conductor levels can be illustrated by pairs of contact elements, of which the strip conductors 72a, 72b of the pair of contact elements 50a, 50b arranged in the uppermost strip conductor level and the strip conductors 72'a, 72'b of the pair of contact elements 50'a, 50'b arranged in the lowermost strip conductor level are indicated.

The invention claimed is:

1. A multi-pole plug connector for contacting a multi-layer circuit board (51) comprising a plurality of contact elements (50a, 50b-50'a, 50'b) arranged in contact element rows (13), with the terminal pins (53a, 53b-53'a, 53'b) of the contact elements (50a, 50b-50'a, 50'b) disposed in a contact element row (13) respectively being equally long, wherein the terminal pins (53a, 53b-53'a, 53'b) of the contact elements (50a, 50b-50'a, 50'b) for contacting contact elements (50a, 50b-50'a, 50'b) of the multi-layer circuit board (51) provided in different circuit board levels (71-71') end with less length in steps from contact element row (13) to contact element row (13).

2. A multi-pole plug connector for contacting a multi-layer circuit board (51) according to claim 1, wherein the contact elements (50a, 50b-50'a, 50'b) arranged in a contact element row (13) are combined into pairs of contact elements (50a, 50b-50'a, 50'b).

3. A multi-pole plug connector for contacting a multi-layer circuit board (51) according to claim 2, wherein the pairs of contact elements (50a, 50b-50'a, 50'b) conduct differential signals.

4. A multi-pole plug connector for contacting a multi-layer circuit board (51) according to claim 2, wherein the pairs of contact elements (50a, 50b-50'a, 50'b) are realized with a predetermined characteristic impedance.

5. A multi-layer circuit board for assembly with a multi-pole plug connector (90), comprising blind holes (60a, 60b-60'a, 60'b) arranged in rows for contacting terminal pins (53a, 53b-53'a, 53'b) of the contact elements (50a, 50b-50'a, 50'b) of the multi-pole plug connector (90) which are arranged in contact element rows (13), and comprising strip conductors (52a, 52b; 72a, 72b-72'a, 72'b) provided in different strip conductor planes (71-71'), wherein the blind holes (60a, 60b-60'a, 60'b) for deliberate contacting of the terminal pins (53a, 53b-53'a, 53'b) of the contact elements (50a, 50b-50'a, 50'b) arranged in contact element rows (13) have different depths in a stepped manner from row to row and end in different strip conductor levels (71-71') of the multi-layer circuit board (51).

6. A multi-layer circuit board for assembly with a multi-pole plug connector (90) according to claim 5, wherein the blind holes (60a, 60b-60'a, 60'b) are deepest at the edge of the multi-layer circuit board (51) and respectively end in a less deep manner in steps behind said edge.

7. A multi-layer circuit board for assembly with a multi-pole plug connector (90) according to claim 5, wherein the blind holes (60a, 60b-60'a, 60'b) arranged in a row are combined into pairs of blind holes (60*a*, 60*b*-60'*a*, 60'*b*) which are arranged next to one another and which are provided for contacting terminal pins (53*a*, 53*b*-53'*a*, 53'*b*) of pairs of contact elements (50*a*, 50*b*-50'*a*, 50'*b*) arranged next to one another in a contact element row (13).

8. A multi-layer circuit board for assembly with a multi-pole plug connector (90) according to claim 7, wherein the strip conductors (52*a*, 52*b*; 72*a*, 72*b*-72'*a*, 72'*b*) associated with the pairs of blind holes (60*a*, 60*b*-60'*a*, 60'*b*) have a predetermined characteristic impedance.

9. A combination of a multi-pole plug connector (90) and a multi-layer circuit board (51), with the plug connector (90) comprising a plurality of contact elements (50*a*, 50*b*-50'*a*, 50'*b*) arranged in contact element rows (13) and with the terminal pins (53*a*, 53*b*-53'*a*, 53'*b*) of the contact elements (50*a*, 50*b*-50'*a*, 50'*b*) arranged in a contact element row (13) respectively being equally long, and the multi-layer circuit board (51) comprising blind holes (60*a*, 60*b*-60'*a*, 60'*b*) arranged in rows for contacting terminal pins (53*a*, 53*b*-53'*a*, 53'*b*) of the contact elements (50*a*, 50*b*-50'*a*, 50'*b*) of the multi-pole plug connector (90) which are arranged in contact element rows (13) and strip conductors (52*a*, 52*b*; 72*a*, 72*b*-72'*a*, 72'*b*) provided in different strip conductor levels (71-71'), wherein the terminal pins (53*a*, 53*b*-53'*a*, 53'*b*) of the contact elements (50*a*, 50*b*-50'*a*, 50'*b*) respectively end with less length in steps from contact element row (13) to contact element row (13) for contacting strip conductors (52*a*, 52*b*; 72*a*, 72*b*-72'*a*, 72'*b*) of the multi-layer circuit board (51) which are arranged in different strip conductor levels (71-71'), and wherein blind holes (60*a*, 60*b*-60'*a*, 60'*b*) are differently deep in steps from row to row for the deliberate contacting of the terminal pins (53*a*, 53*b*-53'*a*, 53'*b*) of the contact elements (50*a*, 50*b*-50'*a*, 50'*b*) arranged in contact element rows (13) and end in different strip conductor levels (71-71') of the multi-layer circuit board (51).

10. A combination of multi-pole plug connector (90) and multi-layer circuit board (51) according to claim 9, wherein the terminal pins (53*a*, 53*b*-53'*a*, 53'*b*) fill the associated blind holes (60*a*, 60*b*-60'*a*, 60'*b*) to an at least approximately complete extent.

11. A combination of multi-pole plug connector (90) and multi-layer circuit board (51) according to claim 9, wherein the contact elements (50*a*, 50*b*-50'*a*, 50'*b*) arranged in a contact element row (13) are combined into pairs of contact elements (50*a*, 50*b*-50'*a*, 50'*b*).

12. A combination of multi-pole plug connector (90) and multi-layer circuit board (51) according to claim 11, wherein the pairs of contact elements (50*a*, 50*b*-50'*a*, 50'*b*) conduct differential signals.

13. A combination of multi-pole plug connector (90) and multi-layer circuit board (51) according to claim 11, wherein the pairs of contact elements (50*a*, 50*b*-50'*a*, 50'*b*) are realized with a predetermined characteristic impedance.

\* \* \* \* \*

UNITED STATES PATENT AND TRADEMARK OFFICE
CERTIFICATE OF CORRECTION

PATENT NO.       : 8,622,751 B2  
APPLICATION NO.  : 13/392933  
DATED            : January 7, 2014  
INVENTOR(S)      : Juergen Lappoehn Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 142 days.

Signed and Sealed this
Twenty-second Day of September, 2015

Michelle K. Lee
*Director of the United States Patent and Trademark Office*